(12) United States Patent
Kageyama et al.

(10) Patent No.: US 7,026,542 B2
(45) Date of Patent: Apr. 11, 2006

(54) COVER GLASS FOR A SOLAR BATTERY, A METHOD FOR PRODUCING THE COVER GLASS AND A SOLAR BATTERY MODULE USING THE COVER GLASS

(75) Inventors: Junichi Kageyama, Yokohama (JP); Kazuo Sato, Yokohama (JP); Mika Kambe, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 52 days.

(21) Appl. No.: 10/805,321

(22) Filed: Mar. 22, 2004

(65) Prior Publication Data

US 2004/0173256 A1 Sep. 9, 2004

Related U.S. Application Data

(63) Continuation of application No. PCT/JP02/13020, filed on Dec. 12, 2002.

(30) Foreign Application Priority Data

Dec. 13, 2001 (JP) ............................. 2001-379556

(51) Int. Cl.
*H01L 31/0236* (2006.01)
*H01L 31/18* (2006.01)
*H01L 31/052* (2006.01)

(52) U.S. Cl. .................. 136/251; 136/256; 136/246; 136/259; 65/66; 65/87; 65/90; 65/93; 65/370.1; 65/253; 65/324; 65/255; 438/38; 438/29; 438/69; 438/65; 438/71; 438/72; 257/435; 257/436; 257/434

(58) Field of Classification Search ................ 136/251, 136/256, 246, 259; 65/66, 87, 90, 93, 370.1, 65/253, 324, 255; 428/38; 438/38, 29, 69, 438/65, 71, 72; 257/436, 434, 435
See application file for complete search history.

(56) References Cited

U.S. PATENT DOCUMENTS

| 3,554,725 | A | * | 1/1971 | Bracken et al. | ............... 65/185 |
| 4,456,336 | A | * | 6/1984 | Chung et al. | ............... 349/160 |
| 5,244,509 | A | * | 9/1993 | Arao et al. | ............... 136/259 |
| 5,939,201 | A | * | 8/1999 | Boire et al. | ............... 428/432 |
| 5,964,962 | A | * | 10/1999 | Sannomiya et al. | ........ 136/256 |
| 6,075,652 | A | * | 6/2000 | Ono et al. | ................... 359/642 |
| 6,156,968 | A | * | 12/2000 | Nishimoto et al. | ......... 136/252 |
| 6,465,727 | B1 | * | 10/2002 | Maruyama et al. | ......... 136/256 |
| 6,498,380 | B1 | * | 12/2002 | Otani et al. | .................. 257/432 |

(Continued)

FOREIGN PATENT DOCUMENTS

DE 33 24232 A1 1/1985

(Continued)

*Primary Examiner*—Alan Diamond
(74) *Attorney, Agent, or Firm*—Oblon, Spivak, McClelland, Maier & Neustadt, P.C.

(57) ABSTRACT

A transparent substrate for a cover for a solar battery and a method for producing the same are presented. Hemispherical concave portions are formed in a surface of light entering side of a cover glass almost over the entire surface wherein the ratio d/D of the depth d of the central portion of each concave portion to the radius D of the opening of the concave portion is from 0.10 to 0.50 and the proportion of area occupied by a flat portion where no concave portion is formed in the surface of light entering side is not more than 40%.

19 Claims, 8 Drawing Sheets

U.S. PATENT DOCUMENTS

| | | | |
|---|---|---|---|
| 2002/0002993 A1* | 1/2002 | Maruyama et al. | 136/258 |
| 2002/0050289 A1* | 5/2002 | Wada et al. | 136/256 |
| 2005/0000564 A1* | 1/2005 | Sato et al. | 136/256 |

FOREIGN PATENT DOCUMENTS

| | | | |
|---|---|---|---|
| JP | 5-129644 A * | 5/1993 | |
| JP | 6-45628 | 2/1994 | |
| JP | 7-25640 | 1/1995 | |
| JP | 7-142749 A * | 6/1995 | |
| JP | 11-74552 | 3/1999 | |
| JP | 11-298030 | 10/1999 | |
| JP | 11-330508 | 11/1999 | |
| JP | 2000-223724 A * | 8/2000 | |
| JP | 2001-358346 | 12/2001 | |

* cited by examiner (a)

(b)

(a)

(b)

(a)

(b)

COVER GLASS FOR A SOLAR BATTERY, A METHOD FOR PRODUCING THE COVER GLASS AND A SOLAR BATTERY MODULE USING THE COVER GLASS

CROSS REFERENCE TO RELATED APPLICATIONS

This is a Continuation Application of PCT Application No. PCT/JP02/13020, filed on Dec. 12, 2002, which was not published under PCT Article 21(2) in English. This application is based upon and claims the benefit of priority from the prior Japanese Patent Application No. 2001-379556, filed Dec. 13, 2001, the entire contents of which is incorporated herein by reference.

TECHNICAL FIELD

The present invention relates to a cover glass for a solar battery, a method for producing the cover glass and a solar battery module using the cover glass. In particular, it relates to a cover glass for a solar battery to be located on a house roof in order to obtain photovoltaic generation, a method for producing the cover glass and a solar battery module using the cover glass.

BACKGROUND ART

In recent years, new energy has been noticed in connection with environmental issues such as increased $CO_2$ and depletion of resource. Among these, photovoltaic generation is considered to be hopeful. A solar battery module which would become the main stream includes a crystal type module and a thin film type module.

The crystal type solar battery module is constructed by arranging a plurality of crystallized plates (wafers) having a small area on a glass plate(a cover glass) having a size as large as the module, connecting these plates with wires, and sealing for protection these by using filler such as EVA (ethylene-vinyl acetate copolymer) and a rear surface protecting material such as Tedler (trade mark).

In the thin film type solar battery module (a substrate-integrate type solar battery module), a transparent electrode layer, a thin film semiconductor layer and a rear surface electrode are formed successively on a glass plate having a size as large as the module directly, separating each layer by a patterning technique such as laser scribing and connecting sections to obtain predetermined voltage and current. As sealing for protection, the same filler and rear surface protecting material as used for the crystal type solar battery module is used.

On the other hand, in view of the recent tendency about the setting-up of solar battery modules, there are often found that they are mounted on house roofs or are set up as a roof-integrate type solar battery module so as to provide the same function as the roof.

When the solar battery module is set up on the house roof, there are considered a problem such as "dazzle" or "glare" caused by a mirror effect at the front surface of the solar battery module at which sunlight is reflected and a problem that scenery or sky reflects on the front surface of the solar battery module to spoil the beauty of the house itself or houses around there.

In connection with such problems, the following contrivance has conventionally been made. In connection with the crystal type solar battery module, for example, use of a figured glass as the cover glass which causes irregular reflection or diffusion of light on the front surface of the cover glass has been proposed. Actually, a figured glass for exclusive use is commercialized as the cover glass usable for such purpose.

Further, in the 16th IEEE Photovoltaic Specialists Conference (minutes P. 828–p. 833) 1982, GE (General Electric Company) disclosed that such figured glass was used for a roofing type solar battery module.

On the other hand, in the thin film solar battery module, there has been studied that sub-modules having a small area are sealed with the same structure as the crystal type solar battery module to prepare the above-mentioned figured glass for exclusive use. Further, JP-A-6-45628 publication proposes that a beads-containing resin capable of diffusing light is coated on the front surface of a completed solar battery module, for example.

However, the above-mentioned method has been developed to solve the problem such as "dazzle" or "glare" caused by the reflection of sunlight on the mirror-like surface of the solar battery module and to obtain a shape of front surface having an antidazzle effect. The proposed shape is not always suited for improving the performance of the solar battery.

For example, in a case of forming a light scattering layer on a front cover glass by using an organic resin as disclosed in JP-A-6-45628 publication, there is a problem that incident light is reflected at the interface due to the difference of refractive index between the resin and the glass to cause reduction in the quantity of the incident light.

Further, there is a problem that since the reflectance of the surface of the solar battery module largely depends on an angle of incident light, a much amount of light is reflected in morning or evening because sunlight enters obliquely, whereby the output of a solar battery decreases extremely.

Further, in any information obtainable until now, there is no specific description about the shape of the front surface as in JP-A-11-330508 publication. Even though the shape of the front surface is quantified, there is no more than the indication of the roughness Ra in arithmetic average as in JP-A-11-74552, and there is no reference to the specific shape for the commercialization of products.

The present invention is to solve the above-mentioned problems and to provide a cover glass for a solar battery capable of improving the output more than by the conventional technique, and having a shape of front surface which can effectively prevent an environmental problem caused by the reflection of light at a light entering side, a method for producing the cover glass and a solar battery module using the cover glass.

DISCLOSURE OF THE INVENTION

In order to achieve the above-mentioned object, the present invention is to provide a cover glass for a solar battery characterized in that hemispherical concave portions are formed in the almost entire surface at a light entering side of a cover glass wherein the ratio d/D of the depth d of the central portion of each concave portion to the radius D of the opening of the concave portion is from 0.10 to 0.50 and the proportion of area of a flat portion where no concave portion is formed, to the surface of light entering side is not more than 40%.

With the cover glass having such shape of front surface, the output can be improved more than that by obtainable in the conventional technique, and an environmental problem caused by the reflection of light at a light entering side can effectively be prevented.

Further, the present invention is to provide the above-mentioned cover glass for a solar battery wherein the number of the concave portions per unit area is at lest 160 number/cm$^2$.

Further, the present invention is to provide a method for producing the cover glass for a solar battery as described above, which is characterize by feeding molten glass between a roll member having an outer surface in which concave/convex portions are formed and another roll member to carry out roll-out processing.

The other roll member may have a flat front surface or a front surface in which concave-convex portions are formed.

By utilizing the roll-out processing method, it is possible to manufacture continuously cover glass having a stable quality. The method is suitably applicable to a large scale production.

EXPLANATION OF REFERENCE NUMERALS

Figure 1:
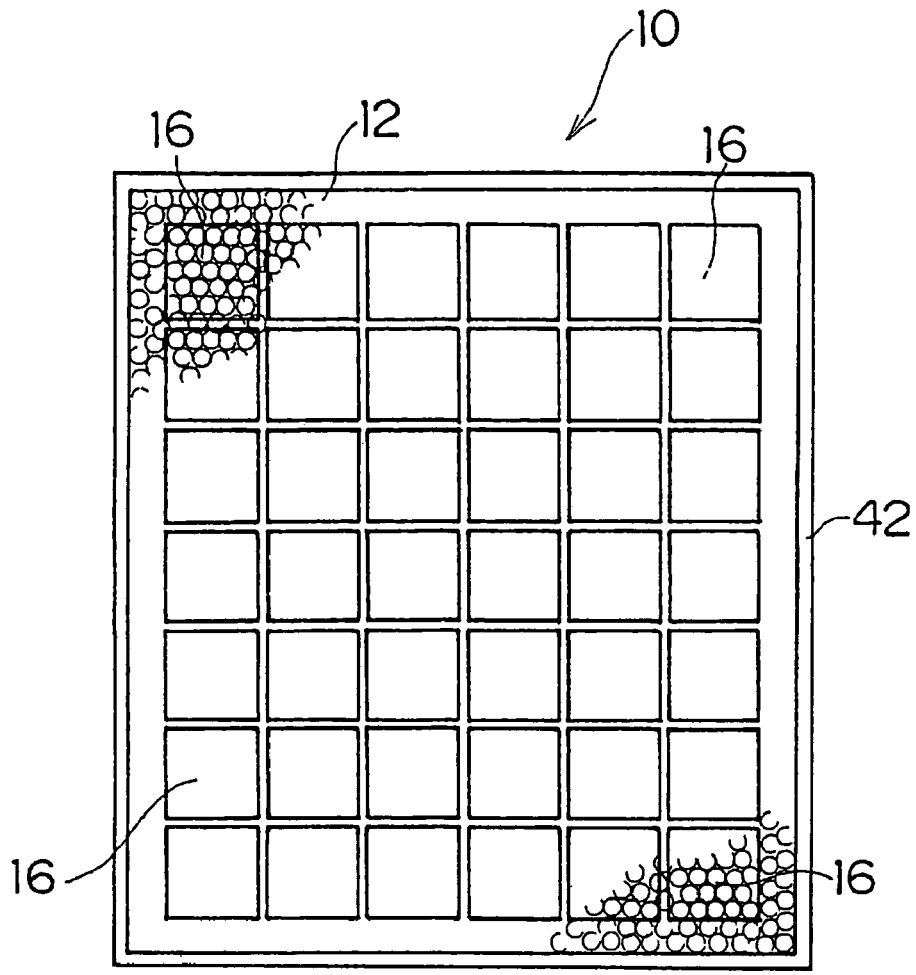
FIG. 1 is a plan view of a solar battery panel to which the cover glass of the present invention is applied.

10 . . . solar battery panel, 12 . . . cover glass for a solar battery, 14 . . . EVA film, 16 . . . polycrystal cell, 17 . . . rear surface protecting material, 18 . . . terminal box, 20 . . . figured glass manufacturing apparatus, 22 . . . melting tank, 24, 26 . . . water-cooled roller, 28 . . . carrier roller, 30 . . . glass ribbon, 40 . . . concave portion, 42 . . . frame member, 44 . . . lead wire

BEST MODE FOR CARRYING OUT THE INVENTION

In the following, preferred embodiments of the cover glass for a solar battery according to the present invention will be described in detail with reference to the drawing.

Figure 2:
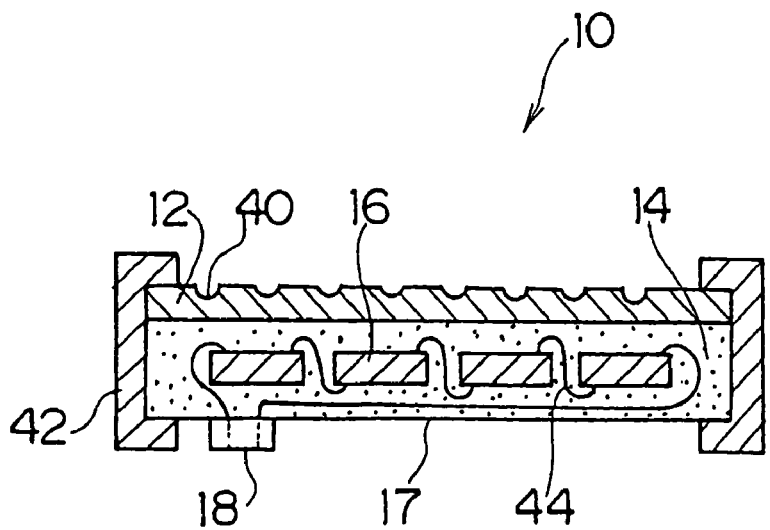
FIG. 2 is a cross-sectional view in a lateral direction of the solar battery panel shown in FIG. 1.

FIG. 1 is a plan view showing diagrammatically the structure of a solar battery panel 10 and FIG. 2 is a cross-sectional view of it. The solar battery panel 10 is formed into a shape of window frame by laminating polycrystal cells 16, 16 . . . of 7 rows×6 columns on a flat rear surface of a cover glass 12 for a solar battery by interposing an EVA film 14, laminating a rear surface protecting material 17 on the polycrystal cells 16, 16 . . . and supporting the circumferential edge portion with a frame member 42. The polycrystal cells 16, 16 . . . are mutually collected in series parallel by using lead wires 44 so that an output can be taken from a terminal box 18 fixed to the rear plan of the rear surface protecting material 17.

The rear surface protecting material 17 is to protect the polycrystal cells 16 from damping, and is comprised of a material comprising an aluminum foil and a fluororesin which is coated on front and rear surfaces of the aluminum foil and which provides a high weathering performance (hereinbelow, referred to as an aluminum-fluororesin laminate).

Figure 3:
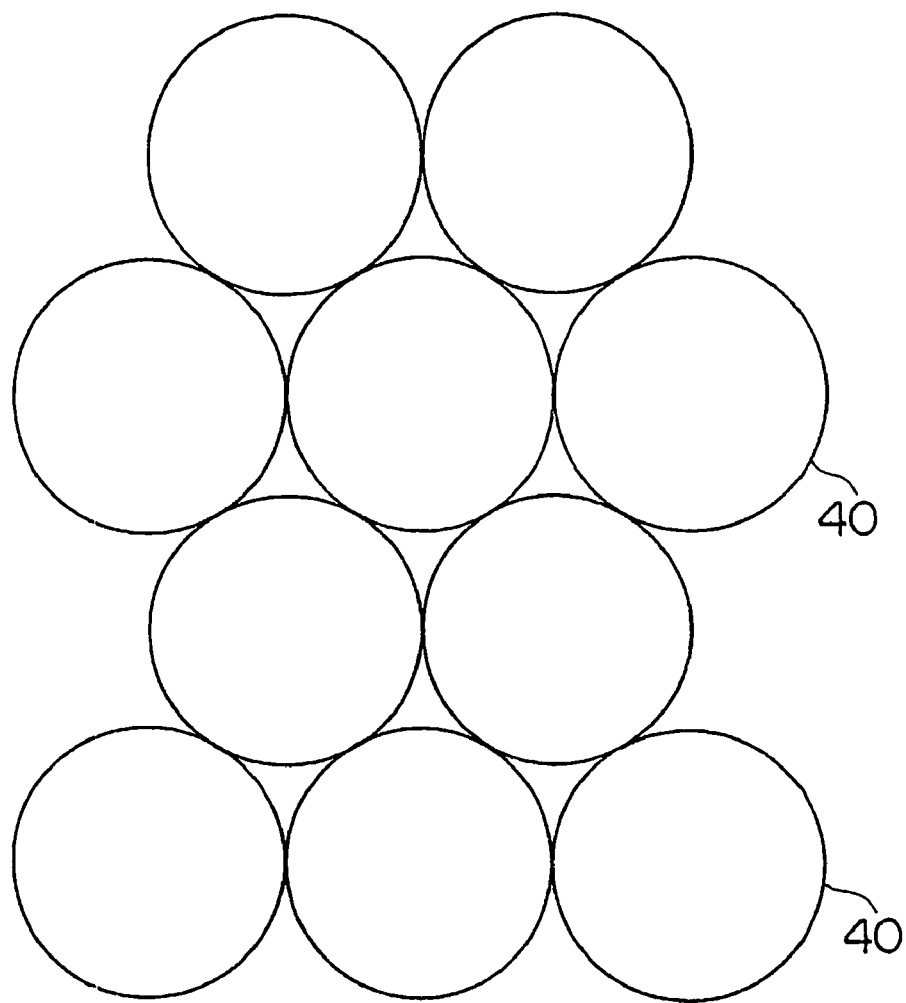
FIG. 3 shows diagrammatically the cover glass for a solar battery according to an embodiment wherein (a) is a plan view and (b) is an enlarged cross-sectional view in a lateral direction.
Figure 3:
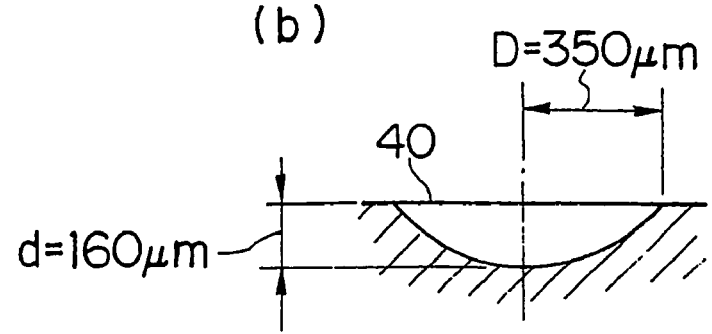
Figure 4:
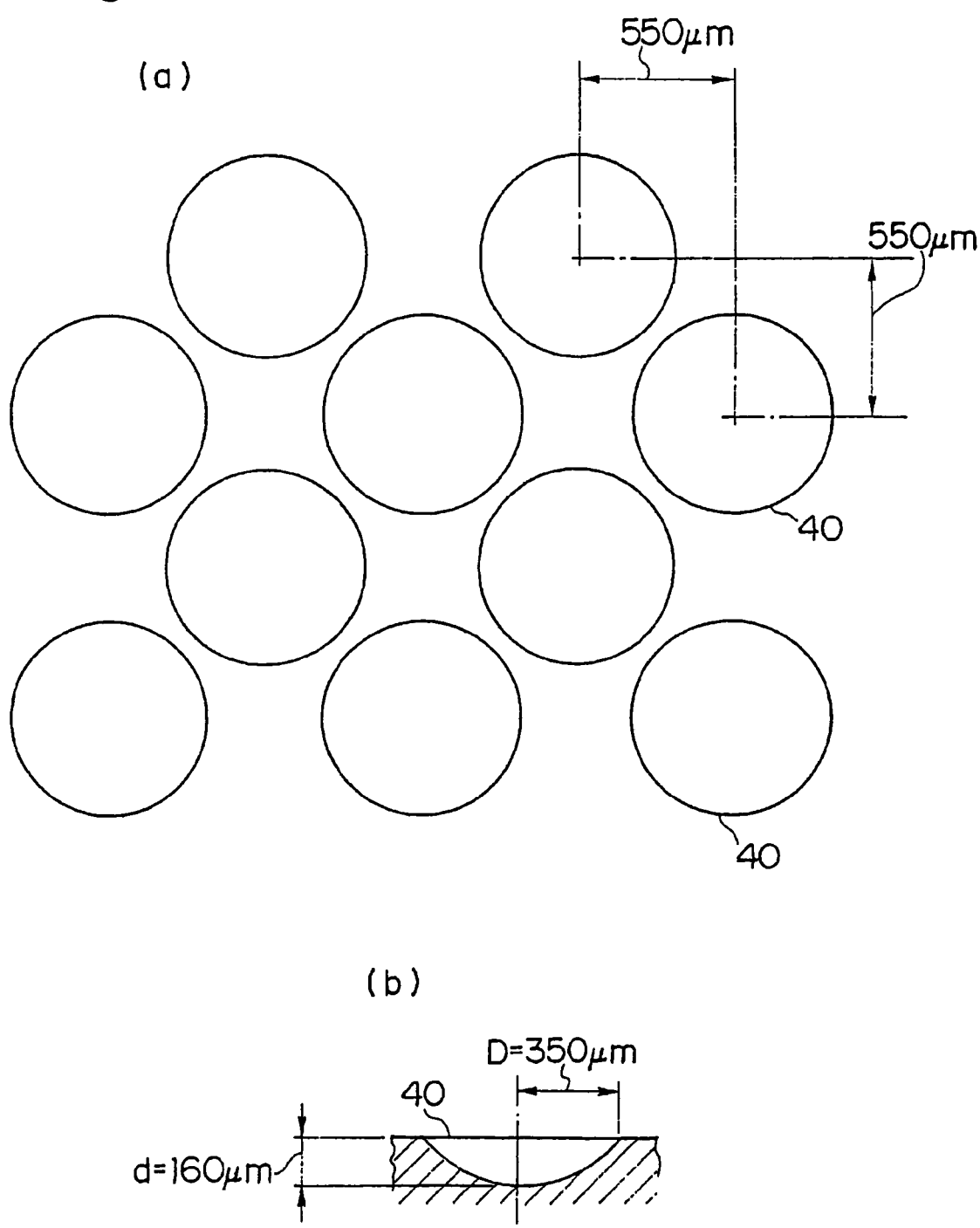
FIG. 4 shows diagrammatically the cover glass for a solar battery according to another embodiment wherein (a) is a plan view and (b) is an enlarged cross-sectional view in a lateral direction.
Figure 5:
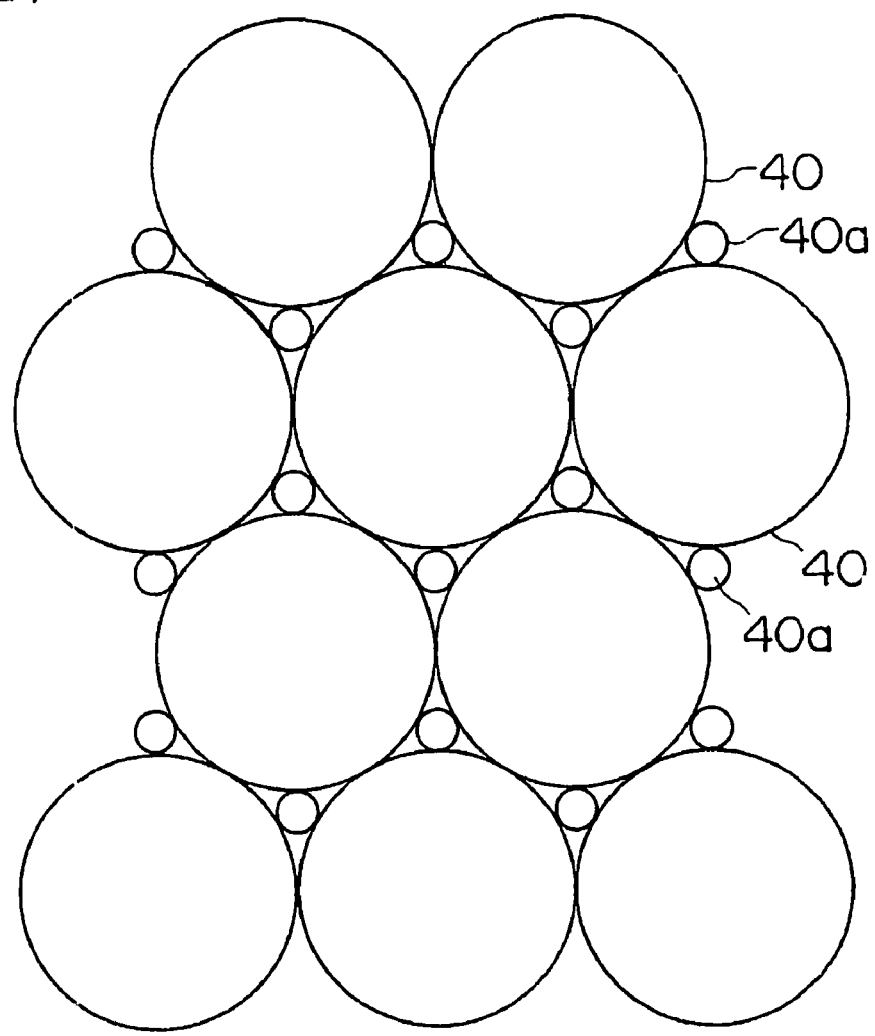
FIG. 5 shows diagrammatically the cover glass for a solar battery according to another embodiment wherein (a) is a plan view and (b) is an enlarged cross-sectional view in a lateral direction.
Figure 5:
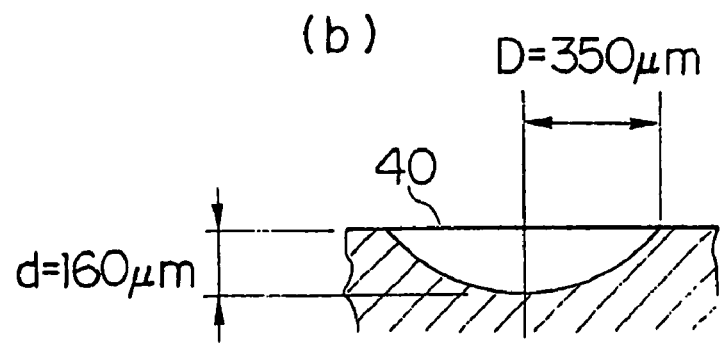
Figure 6:
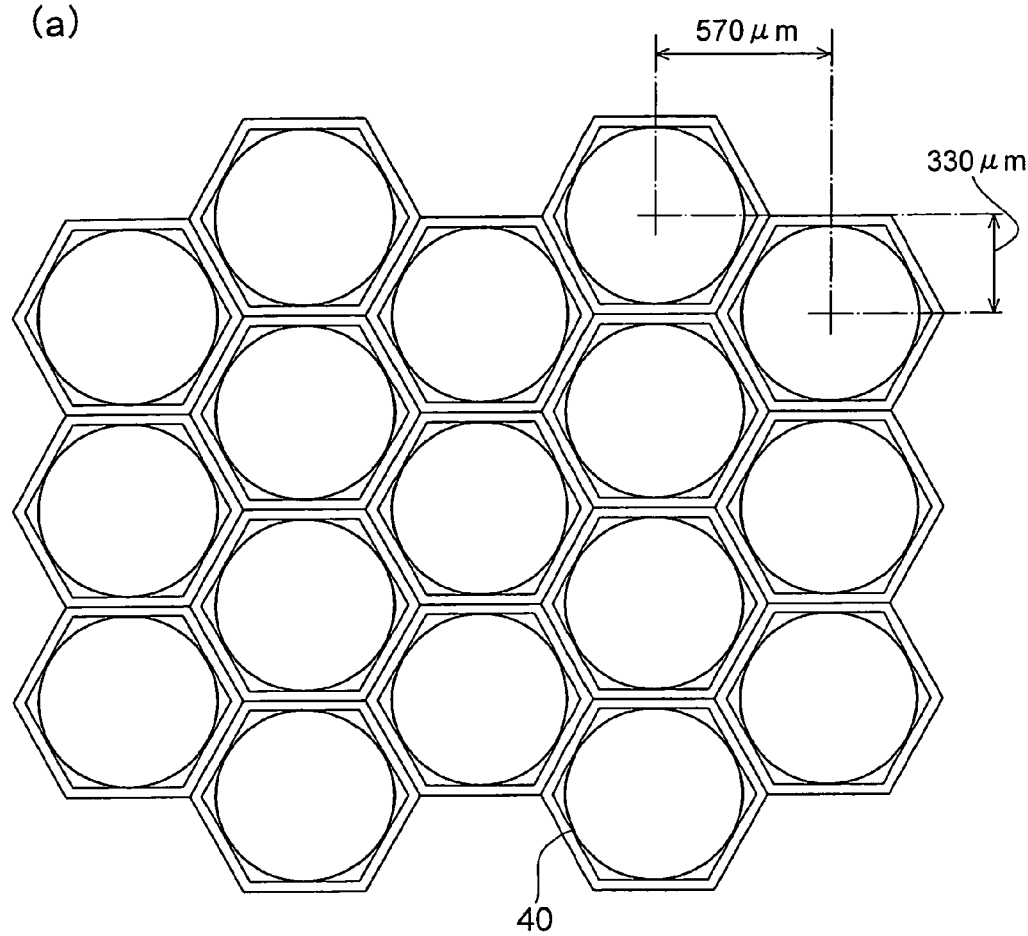
FIG. 6 shows diagrammatically the cover glass for a solar battery according to another embodiment wherein (a) is a plan view and (b) is an enlarged cross-sectional view in a lateral direction.
Figure 6:
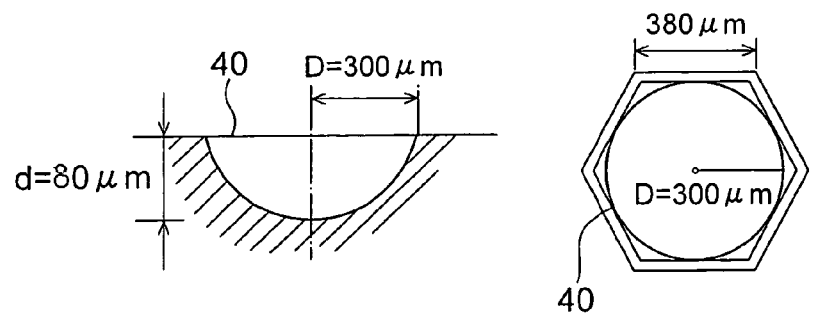

In the cover glass 12, hemispherical concave portions 40 are formed in the almost entire surface at a light entering side of the cover glass (see FIGS. 3 to 6) so that a much quantity of incident light can be obtained throughout daytime, hence, the output becomes high; the cover glass keeps a stainless state and antidazzle performance is increased, wherein the ratio d/D of the depth d of the central portion of each concave portion 40 to the radius D of the opening of the concave portion 40 is 0.457 in FIGS. 3 to 5 and is 0.267 in FIG. 6. Further, the proportion of area of a flat portion where no concave portion 40 is formed to the surface of light entering side is 9.3% in FIG. 3, 36% in FIG. 4, 5.0% in FIG. 5 and 25% in FIG. 6 respectively. The detailed explanation of the cover glass 12 will be described in the following.

Figure 8:
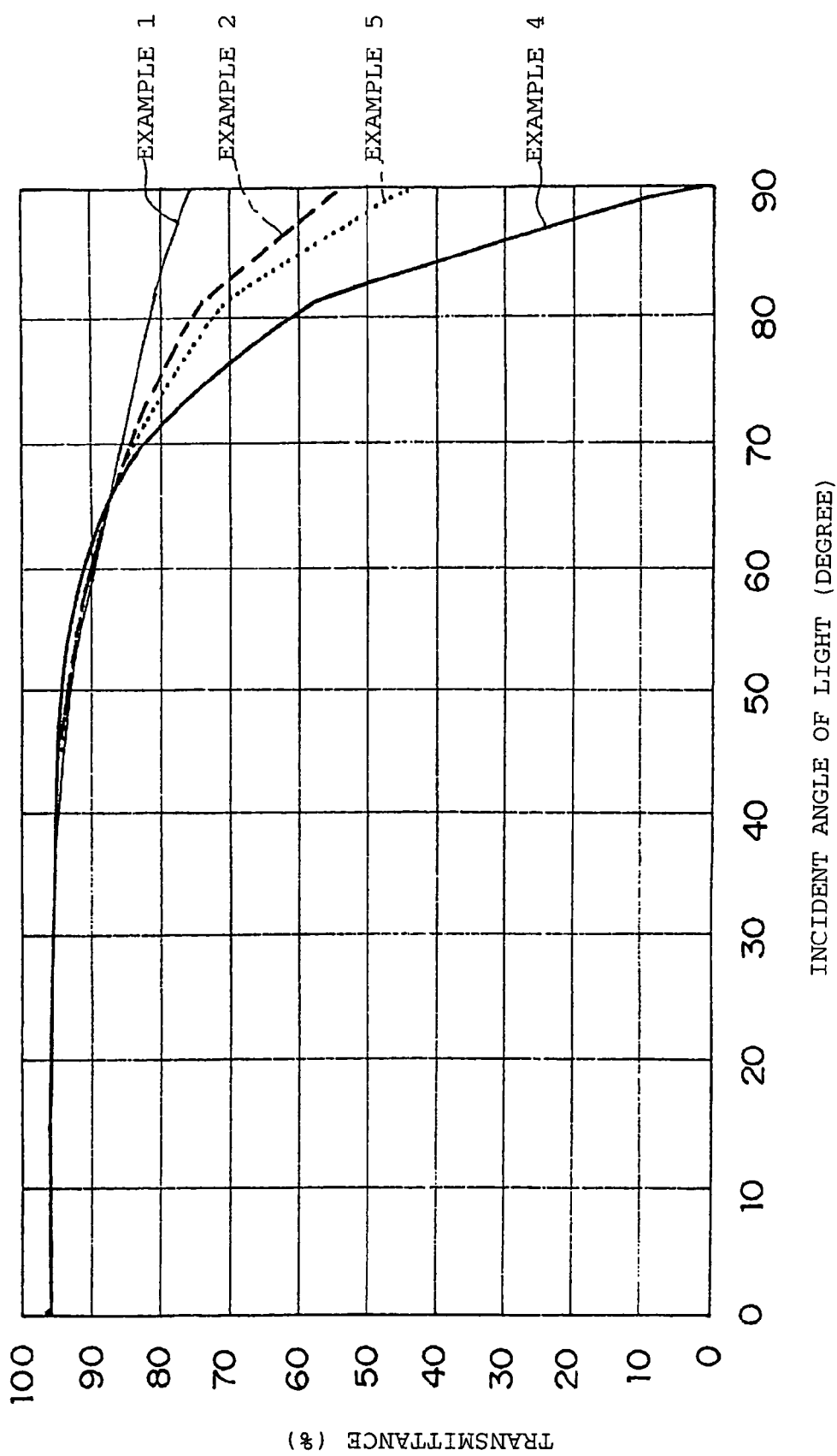
FIG. 8 is a graph showing the light transmittance characteristics of the cover glass for a solar battery.

FIGS. 3 to 6 are diagrammatical views of the cover glass for a solar battery. In each figure, (a) shows a plan view and (b) shows an enlarged cross-sectional view in a lateral direction. FIG. 8 is a graph showing the light transmittance characteristics of the cover glass for a solar battery.

As shown in FIG. 3(b), FIG. 4(b) and FIG. 5(b), the radius D of the opening of the concave portion 40 is 350 μm and the depth d of the central portion of the concave portion 40 is 160 μm whereby d/D is 0.457. Further, as shown in FIG. 6(b), the radius D of the opening of the concave portion 40 is 300 μm and the depth d of the central portion of the concave portion 40 is 80 μm whereby d/D is 0.267.

In FIG. 3(a) showing the arrangement of concave portions 40 in plan view, they are arranged in a pattern of circles in point contact. Namely, concave portions 40, 40 are arranged laterally, and concave portions 40, 40 at upper and lower stages are arranged latterly with a shift of half pitch of circle. Further, the concave portions 40, 40 at upper and lower stages are also arranged in adjacent to each other. Thus, the arrangement provides a closed-packing structure.

The pitch in a lateral direction is 700 μm and the pitch in a vertical direction is 606 μm. Further, as described before, the radius D of the opening is 350 μm. Accordingly, the proportion of area of a flat portion where no concave portion 40 is formed, to the surface of light entering side is 9.3%. Further, the number of the concave portions per unit area is 240 number/cm$^2$.

In FIG. 4(a), the arrangement of the concave portions 40 in plan view is such that a lattice-like arrangement pattern is rotated 45°. The pitch in a lateral direction is 550 μm and the pitch in a vertical direction is 550 μm. Further, as described before, the radius D of the opening is 350 μm. Accordingly, the proportion of area of a flat portion where no concave portion is formed, to the surface of light entering side is 36%. Further, the number of the concave portions per unit area is 170 number/cm$^2$.

In FIG. 5(a), the arrangement of the concave portions 40 in plan view indicates a pattern of circles in point contact in the same manner as the case of FIG. 3(a). As a result, the pitch in a lateral direction is 700 µm and the pitch in a vertical direction is 606 µm. Further, as described before, the radius D of the opening portion is 350 µm. This structure is such that the area of flat portion can be minimized by forming concave portions 40a of smaller diameter in the flat portion where no concave portion 40 is formed. Accordingly, the proportion of area of a flat portion where no concave portion 40 is formed, to the surface of light entering side, is 5.0%. Further, the number of the concave portions per unit area is 707 number/cm$^2$.

In FIG. 6(a), the arrangement of the concave portions 40 in plan view is such that the arrangement pattern in FIG. 3(a) is slightly dispersed. Namely, neighboring concave portions 40 are arranged with a slight space to each other (40 µm×2 in FIG. 6). The hexagon surrounding each concave portion 40 is for convenience so as to make the arrangement of the concave portions 40 easy to see and it does not indicate the presence of a groove or a projection. Further, the radius D of the opening is 300 µm and the depth d of the central portion of the concave portion 40 is 80 µm whereby d/D is 0.267. Further, the proportion of area of the flat portion where no concave portion 40 is formed, to the surface of light entering side is 25%. Further, the number of the concave portions per unit area is 270 number/cm$^2$.

Figure 7:
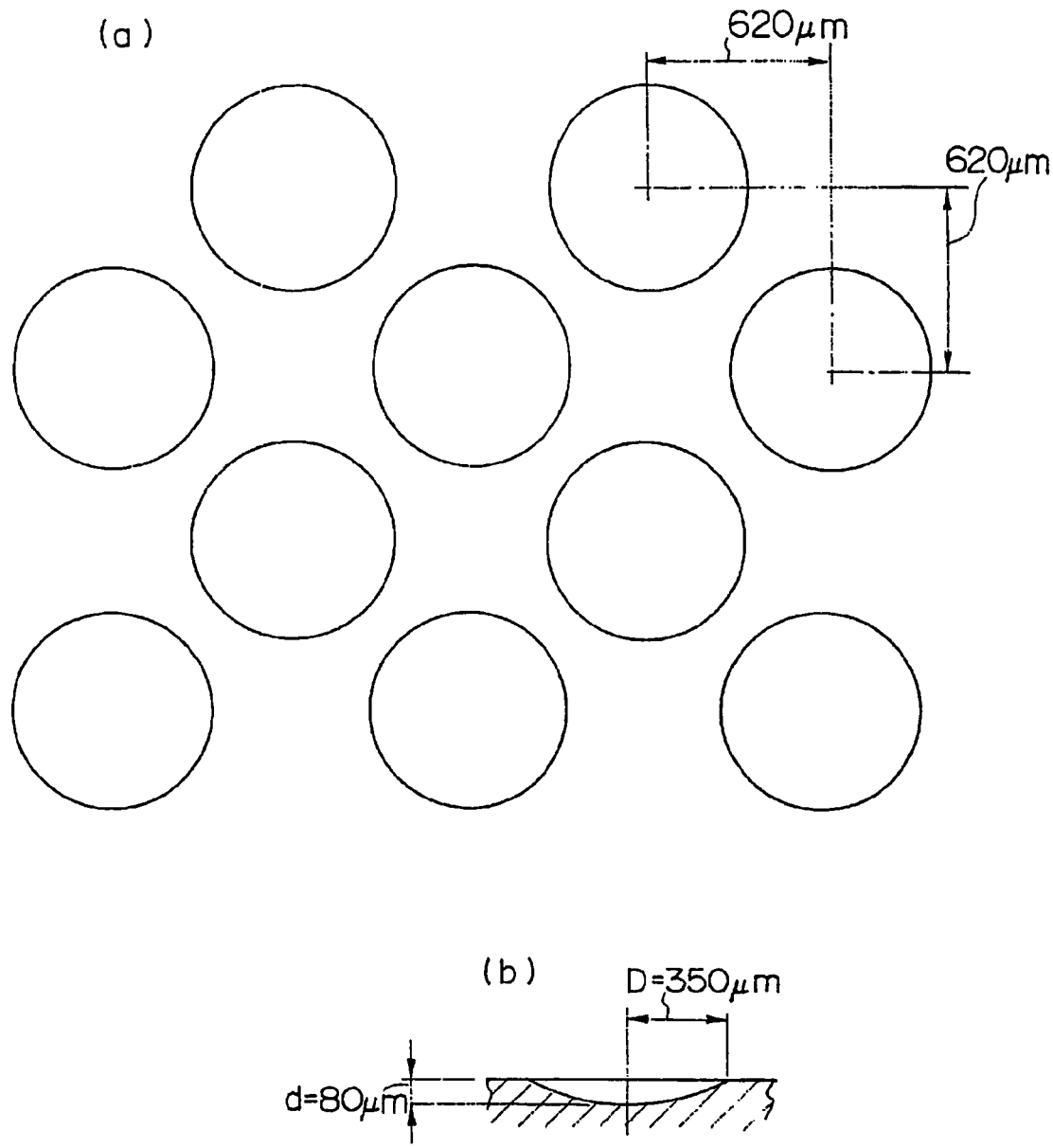
FIG. 7 shows diagrammatically the cover glass for a solar battery according to a Comparative Example wherein (a) is a plan view and (b) is an enlarged cross-sectional view in a lateral direction.

In FIG. 7 shown as Comparative Example, the radius D of the opening of a concave portion 40 is 350 µm and the depth d of the central portion of the concave portion 40 is 80 µm whereby d/D is 0.229 (see FIG. 7(b)). Further, in FIG. 7(a), the arrangement of concave portions 40 in plan view is such that a lattice-like arrangement pattern is rotated 45°. The pitch in a lateral direction is 620 µm and the pitch in a vertical direction is 620 µm. Further, as described before, the radius D of the opening is 350 µm. Accordingly, the proportion of area of a flat portion where no concave portion 40 is formed, to the surface of light entering side is 50%. Further, the number of the concave portions per unit area is 130 number/cm$^2$.

The light transmittance characteristics of the above-mentioned cover glass 12 for a solar battery will be described with reference to the graph in FIG. 8. In FIG. 8, Example 1 indicates the characteristics of the cover glass 12 having the structure shown in FIG. 3 and Example 2 indicates the characteristics of the cover glass 12 having the structure shown in FIG. 4. Further, Examples 4 and 5 are Comparative Examples wherein Example 4 indicates the characteristics of a flat glass plate having no concave portion 40 and Example 5 indicates the characteristics of the cover glass having the structure shown in FIG. 7.

In any Example described above, the light transmittance indicates a value of not less than 95% at an incident angle of light of from 0° to about 40°; the reduction becomes large at or beyond an angle of around 60°, and the reduction is maximum at 90°. However, the inclination of reduction in Examples 1 and 2 of the present invention is smaller than that of Examples 4 and 5 as Comparative Examples in the region of a light incident angle of around 65° or more. Namely, the cover glass of the present invention provides an advantage that incident angle dependence is small whereby light can be taken into the solar battery even when light enters from any angle.

Accordingly, the coefficient of utilization of light in the region of a light incident angle of around 65° or more in the Examples of the present invention differs largely from that in Comparative Examples. The electric power from the solar cell thus obtainable will be described later.

Various conditions other than the above-mentioned have been studied to find the optimum range as described below, with respect to d/D, the proportion of area occupied by the flat portion and the number of the concave portions per unit area.

When the value of d/D is less than 0.10, a good result can not be obtained. On the other hand, when the value of d/D exceeds 0.5, it is difficult to manufacture the cover glass. The value of d/D is preferably from 0.15 to 0.50, more preferably, from 0.30 to 0.50, further preferably, from 0.45 to 0.50 from the viewpoint of the light transmittance characteristics.

When the proportion of area of the flat portion where no concave portion 40 is formed, exceeds 40%, the transmittance decreases at a large light incident angle whereby the output of the solar battery becomes low. The proportion of area occupied by the flat portion where no concave portion 40 is formed, is preferably 30% or less, more preferably, 20% or less, further preferably 10% or less from the viewpoint of the light transmittance characteristics.

Further, when the number of the concave portions 40 per unit area is less than 160 number/cm$^2$, the transmittance becomes low at a large light incident angle whereby the exchange efficiency of solar battery becomes low. It is preferred that the number of the concave portions 40 per unit area is at least 170 number/cm$^2$, more preferably, at least 200 number/cm$^2$ from the viewpoint of the light transmittance characteristics. The number of the concave portions 40 per unit area can be obtained by counting the concave portions arranged in an optical range of 1 cm×1 cm in the front surface of the cover glass.

Figure 9:
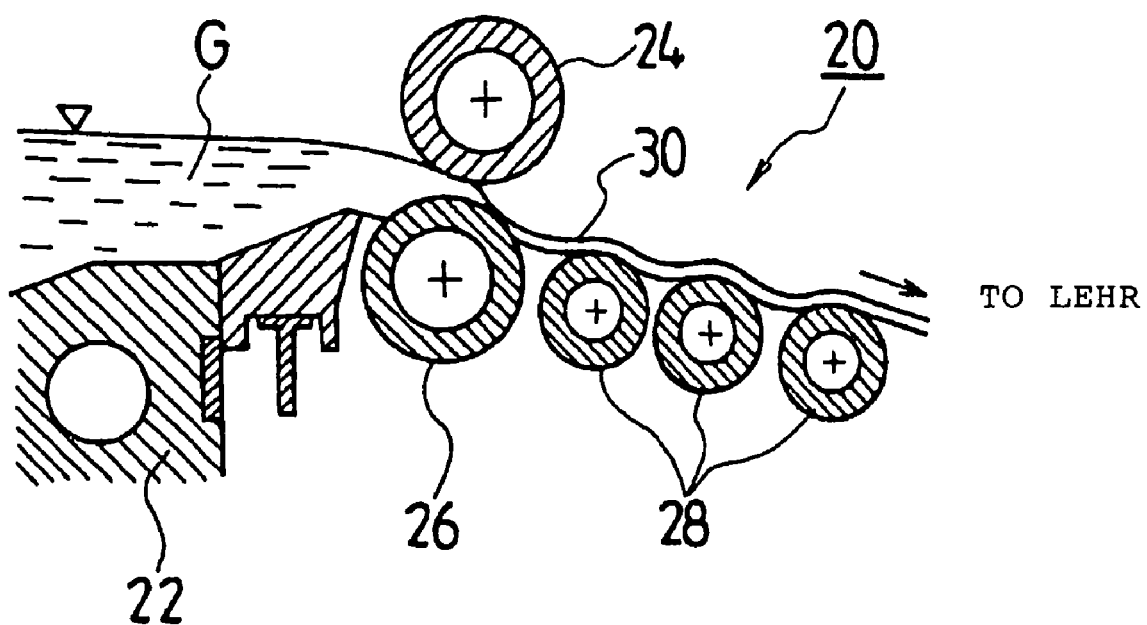
FIG. 9 is a diagrammatical structural view of a figured glass manufacturing apparatus.

The cover glass 12 is produced by a figured glass manufacturing apparatus 20 as shown in FIG. 9. The figured glass manufacturing apparatus 20 comprises a melting tank 22, a pair of upper and lower water-cooled rollers 24, 26, carrier rollers 28, 28 . . . and so on. Molten glass G in the melting tank 22 is fed continuously between the water-cooled rollers 24, 26 through the dam of the melting tank 22 to be shaped into a glass ribbon 30 having a thickness which is substantially equal to the gap between the water-cooled rollers 24, 26. Further, the glass ribbon 30 is drawn out according to the revolution of the water-cooled rollers 24, 26 and is conveyed by means of carrier rollers 28, 28 . . . into a lehr (not shown) in which it is gradually cooled to the room temperature. Thus, the cover glass 12 is produced.

In manufacturing, the outer surface of a water-cooled roller 26 (or a water-cooled roller 24) has a regularly arranged convex pattern so that hemispherical concave portions are formed in the almost entire surface at a light entering side of the cover glass 12 wherein the ratio d/D of the depth of the central portion of each concave portion to the radius D of the opening of the concave portion is from 0.10 to 0.50 and the proportion of area of a flat portion where no concave portion is formed, to the surface of light entering side is not more than 40%. Since the regularly arranged convex pattern of the water-cooled roller 26 is transferred to a surface (which correspond to the surface of light entering side 13 of the cover glass 12) of the glass ribbon 30, it is unnecessary to carry out processing such as polishing, etching, blasting and so on, and the cover glass 12 having excellent quality can be produced.

The cover glass 12 for a solar battery can be used not only for a cover glass for a solar battery to be set up on the roof of buildings but also for a cover glass for a solar battery to be set up on a fence or wall. Further, any type of polycrystal, monocrystal or amorphous can be used for the solar battery.

A concave-convex pattern may also be formed in the surface opposite to the light entering side of the cover glass 12 for a solar battery. In the embodiments described before, the rear surface protecting material 17 composed of a film-like aluminum-fluororesin laminate is used. However, another film-like organic material, a plate-like organic material, an inorganic material (e.g., glass), an organic-inorganic composite material or the like may be used.

EXAMPLES

Polycrystal cells 16 are formed by forming a p-n junction (not shown) in, for example, a silicon substrate and providing a comb-shaped electrode made of silver or the like on both front and rear surfaces. The polycrystal cells 16 are connected in series with lead, wires made of copper or the like. Further, polycrystal cells 16 at edge portions are connected in series parallel with lead wires so as to obtain a predetermined output, and an electromotive force is taken from a terminal box 18 constituting a terminal section provided at a rear surface side of a solar battery module constituting a solar battery panel 10.

A rear surface protecting material 17 is disposed at a rear surface side of the polycrystal cells 16. At a front surface side of the polycrystal cells 16, a cover glass 12 for a solar battery is disposed. A transparent resin such as an ethylene-vinyl acetate film (EVA film) 14 is filled and bonded between the cover glass 12 for a solar battery and the rear surface protecting material 17. A frame member 42 made of aluminum or the like is disposed at a circumferential portion of the cover glass 12 for a solar battery and the protecting sheet.

The thickness of the cover glass 12 for a solar battery is 3.2 mm and the transmittance to visible light is about 91%. Further, the cover glass 12 for a solar battery as a test specimen is modularized by connecting 42 polycrystal cells of 150 mm square in series parallel on a glass plate of about 1,000 mm square as shown in FIG. 1. As the method for manufacturing, the laminate having the structure shown in FIG. 1 is put in a rubber bag, depressurizing and heating it at 150° C. for 30 min in an oven, and then, cooling as it is to thereby form a modular structure. After the cooling, the terminal box is attached to the module.

The thus prepared solar battery module was set up in the open air in Kanagawa Prefecture so as to have a direction of due south and an inclination angle of about 30° and the power generation test was conducted for 1 year.

Further, a test for antidazzle property was conducted. In the test, the module was attached to a frame at an angle of 30° to observe visually the degree of reflection of the light of the sun at the due south in fine days (sensory test).

Results of evaluation are shown in Table 1.

TABLE 1

| | Shape of cover glass | | | | | Amount of electric power from solar battery | | Improvement in comparison with Example 4 [%] | | |
| --- | --- | --- | --- | --- | --- | --- | --- | --- | --- | --- |
| Shape | Depth d (μm) | Radius D (μm) | Depth/ Radius d/D | Pitch (μm) | Flatness (The proportion of area of a flat portion where no concave portion is formed.) (%) | Number per unit area (Number/ cm$^2$) | Amount of electric power generated in June (kWh) | Amount of electric power generated throughout the year (kWh) | Amount of electric power generated in June | Amount of electric power generated throughout the year | Anti-dazzle property |
| Ex. 1 | 160 | 350 | 0.457 | — | 9.3 | 240 | 12.5 | 159.1 | 5 | 1.92 | ◎ |
| Ex. 2 | 160 | 350 | 0.457 | 550 | 36 | 170 | 12.3 | 158.1 | 3.4 | 1.28 | ◎ |
| Ex. 3 | 80 | 300 | 0.267 | — | 25 | 270 | 12.4 | 158.5 | 4.2 | 1.54 | ◎ |
| Ex. 4 | 0 | ∞ | — | — | 100 | — | 11.9 | 156.1 | (0) | (0) | X |
| Ex. 5 | 80 | 350 | 0.229 | 620 | 50 | 130 | 12.2 | 157.4 | 2.5 | 0.83 | ○ |
| Ex. 6 | — | — | — | — | — | — | 12 | 156.6 | 0.8 | 0.32 | ○ |

In Table 1, Example 1 shows the characteristics of the cover glass 12 having the structure shown in FIG. 3, Example 2 shows the characteristics of the cover glass 12 having the structure as shown in FIG. 4 and Example 3 shows the characteristics of the cover glass 12 having the structure as shown in FIG. 6 respectively. Examples 4 to 6 are Comparative Examples wherein Example 4 shows the characteristics of a flat plate glass without having concave portion 40, Example 5 shows characteristics of the cover glass having the structure as shown in FIG. 7 and Example 6 shows the characteristics of a glass plate having a rough surface as pear skin.

The shape of the front surface of each cover glass 12 for a solar battery is represented by the depth d of the central portion of a convex portion, the radius D of the opening of the convex portion, the ratio of both parameters d/D, the proportion of area occupied by a flat portion where no concave portion is formed and the number of the concave portion 40 per unit area.

There are two kinds of electric power from solar battery: the total generation quantity in Jun. wherein the incident angle of sunlight approaches verticality and the total electric power obtainable throughout the year. Each case is shown with a value (unit: %) indicating an improvement in comparison with the value of Example 4 (using the glass having a flat surface (mirror surface)).

The antidazzle property was determined based on the following standard.

⊚: Sufficient antidazzle property and no reflection.

○: A little reflection but no problem in practical use.

×: Insufficient antidazzle property and dazzling of reflection of sunlight.

As understood from the experimental results described above, the cover glass 12 for a solar battery in Example 1, Example 2 and Example 3 wherein the ratio d/D of the depth d of the central portion of each concave portion to the radius D of the opening of the concave portion is from 0.10 to 0.50 and the proportion of area of a flat portion where no concave portion is formed, to the surface of light entering side is not more than 40% showed respectively an improvement of 5.0%, 3.4% and 4.2% in terms of the electric power in Jun. and 1.92%, 1.28% and 1.54% in terms of the total electric power throughout the year, in comparison with the conventional article (Example 4). Further, They could increase the antidazzle property.

On the other hand, in Example 5 and Example 6 as the conventional articles, they showed an improvement of 2.5% and 0.8% in terms of the power generation quantity in Jun. and 0.83% and 0.32% in terms of the total electric power throughout the year.

The above-mentioned Examples of the present invention have been explained by exemplifying a crystal type solar battery module. However, the present invention is not limited to the solar battery module having such type but can be applied to a super-straight type or sub-straight type solar battery module composed of an amorphous material.

INDUSTRIAL APPLICABILITY

As described above, according to the solar battery module of the present invention, the quantity of incident light to the solar battery module can be increased in day time or throughout the year to increase the electric power because semispherical concave portions are arranged to provide a closed-packing structure in a front surface of a transparent glass disposed at a light entering side of a solar battery element. Further, since sunlight is reflected dispersibly so that the reflection of sunlight can be minimized whereby there are little possibility that neighborhood residents are annoyed and road passengers are dazzled by the reflection light from the solar battery module. Further, a beautiful environment can be maintained.

The entire disclosure of Japanese Patent Application No. 2001-379556 filed on Dec. 13, 2001 including specification, claims, drawings and summary is incorporated herein by reference in its entirety.

What is claimed is:

1. A method for producing a cover glass for a solar battery, the cover glass comprising hemispherical concave portions formed substantially over an entire surface at a light entering side wherein a ratio d/D of a depth d of a central portion of each concave portion to a radius D of an opening of the concave portion is from 0.10 to 0.50 and a proportion of area of a flat portion where no concave portion is formed to a surface of the light entering side is not more than 40%, the method comprising:

producing said cover glassy feeding molten glass between a roll member having an outer surface in which concave/convex portions are formed and another roll member to carry out a roll-out processing.

2. The method for producing the cover glass according to claim 1, wherein the number of the concave portions per unit area is at least 160 number/cm$^2$.

3. The method for producing the cover glass according to claim 1, wherein the proportion of area of a flat portion is not more than 30%.

4. The method for producing the cover glass according to claim 1, wherein the proportion of area of a flat portion is not more than 20%.

5. The method for producing the cover glass according to claim 1, wherein the proportion of area of a flat portion is not more than 10%.

6. The method for producing the cover glass according to claim 1, wherein a light transmittance of the cover glass at an incident angle of about 70 degrees is about 86%.

7. The method for producing the cover glass according to claim 6, wherein the light transmittance of the cover glass at an incident angle of about 80 degrees is approximately 82%.

8. The method for producing the cover glass according to claim 7, wherein the light transmittance of the cover glass at an incident angle of about 90 degrees is approximately 76%.

9. The method for producing the cover glass according to claim 1, wherein a light transmittance of the cover glass at an incident angle of about 70 degrees is approximately 84%.

10. The method for producing the cover glass according to claim 9, wherein the light transmittance of the cover glass at an incident angle of about 80 degrees is approximately 75%.

11. The method for producing the cover glass according to claim 10, wherein the light transmittance of the cover glass at an incident angle of about 90 degrees is approximately 54%.

12. The method for producing the cover glass according to claim 9, wherein the light transmittance of the cover glass at an incident angle of about 80 degrees is approximately 72%.

13. The method for producing the cover glass according to claim 12, wherein the light transmittance of the cover glass at an incident angle of about 90 degrees is approximately 44%.

14. The method for producing the cover glass according to claim 8, wherein d =160 μm, D =350 μm, and the number of the concave portions per unit area is about 240 number/cm$^2$.

15. The method for producing the cover glass according to claim 11, wherein d =160 μm, D =350 μm, an arrangement pitch in lateral and vertical directions is 550 μm, and the number of the concave portions per unit area is about 170 number/cm$^2$.

16. A method for producing a cover glass for a solar battery, comprising:

feeding molten glass between a roller member having an outer surface with regular pattern of concave/convex portions and another roller member to carry out a roll-out processing, wherein the resulting cover glass comprises a regular pattern of hemispherical concave portions formed substantially over an entire surface at a light entering side wherein a ratio d/D of a depth d of a central portion of each concave portion to a radius D of an opening of the concave portion is from 0.10 to 0.50 and a proportion of area of a flat portion where no concave portion is formed to a surface of the light entering side is greater than 9% and not more than 40%.

17. A solar battery module including a crystal cell, the solar battery module comprising:

a cover glass having a first surface adjacent to the crystal cell and a light entering side opposite to the first surface, the cover glass comprising hemispherical concave portions formed substantially over an entire surface of the light entering side wherein a ratio d/D of a depth d of a central portion of each concave portion to a radius D of an opening of the concave portion is from 0.10 to 0.50 and a proportion of area of a flat portion where no concave portion is formed to a surface of the light entering side is not more than 40%.

18. The solar battery module according to claim 17, wherein the number of the concave portions per unit area is at least 160 number/cm$^2$.

19. The solar battery module according to claim 17, wherein the proportion of area of the flat portion is larger than 9% and not more than 40%.

* * * * *